(12) United States Patent
Phan

(10) Patent No.: US 6,227,637 B1
(45) Date of Patent: May 8, 2001

(54) CIRCUIT AND METHOD FOR ENCODING AND RETRIEVING A BIT OF INFORMATION

(75) Inventor: Tuan Phan, San Jose, CA (US)

(73) Assignee: LSI Logic Corporation, Milpitas, CA (US)

( * ) Notice: Subject to any disclaimer, the term of this patent is extended or adjusted under 35 U.S.C. 154(b) by 0 days.

(21) Appl. No.: 09/078,746

(22) Filed: May 14, 1998

(51) Int. Cl.[7] ................................................. H01H 37/76
(52) U.S. Cl. .............................................. 325/525; 365/225.7
(58) Field of Search .......................... 327/525; 365/225.7

(56) References Cited

U.S. PATENT DOCUMENTS

| | | | |
|---|---|---|---|
| 4,716,302 | * 12/1987 | Flannagan et al. ................ | 327/525 |
| 5,418,487 | * 5/1995 | Armstrong, II ................... | 327/525 |
| 5,446,402 | * 8/1995 | Yoshimori ......................... | 327/525 |
| 5,446,698 | * 8/1995 | McClure ........................... | 365/230.03 |
| 5,557,618 | * 9/1996 | Kogan et al. ..................... | 371/10.3 |
| 5,663,902 | * 9/1997 | Bennett et al. ................... | 365/96 |
| 5,715,253 | * 2/1998 | Kim et al. ........................ | 371/10.3 |
| 5,764,575 | * 6/1998 | Kawai et al. ..................... | 365/200 |
| 5,818,285 | * 10/1998 | Lee et al. ......................... | 327/525 |
| 5,838,076 | * 11/1998 | Zarrabian et al. ................ | 327/525 |
| 5,838,902 | * 11/1998 | Shin ................................. | 395/186 |
| 6,054,893 | * 4/2000 | Singh ............................... | 327/525 |

* cited by examiner

Primary Examiner—Kenneth B. Wells

(57) ABSTRACT

An information circuit in a semiconductor device suitable for encoding and retrieving a bit of information. The information circuit includes an input circuit and an output circuit. The input circuit includes an input node coupled to an input terminal of a transistor. The output circuit includes a load device, a fuse circuit, and first and second output terminals of the transistor all coupled in series between a power supply terminal and a ground terminal. The impedance of said fuse circuit is preferably alterable between an initial impedance and an altered impedance. An output node of said information circuit is coupled to said output circuit. The information circuit is configured such that the output node voltage is indicative of said impedance of said fuse circuit when said input node is biased to a "read" state, said power supply terminal is biased to a power supply voltage, and said ground terminal is grounded.

9 Claims, 3 Drawing Sheets

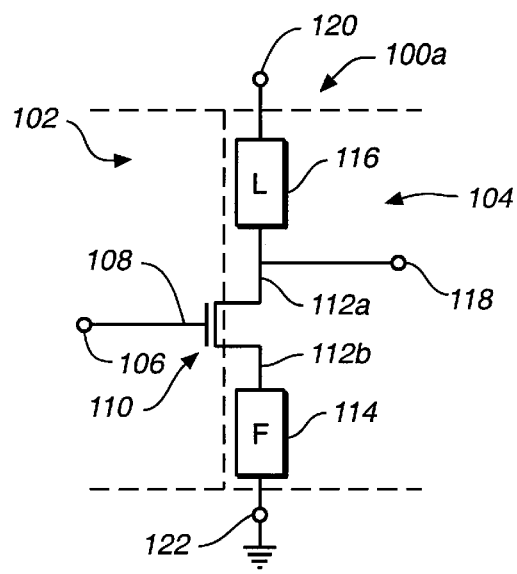
FIG._1
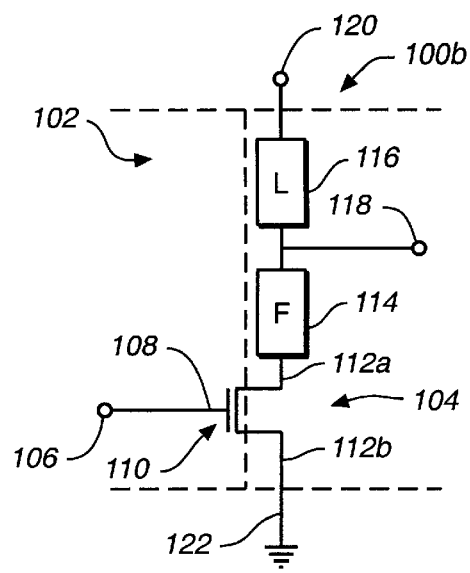
FIG._2
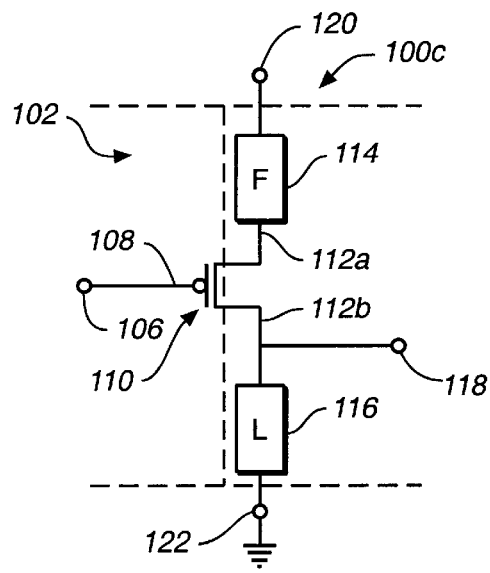
FIG._3
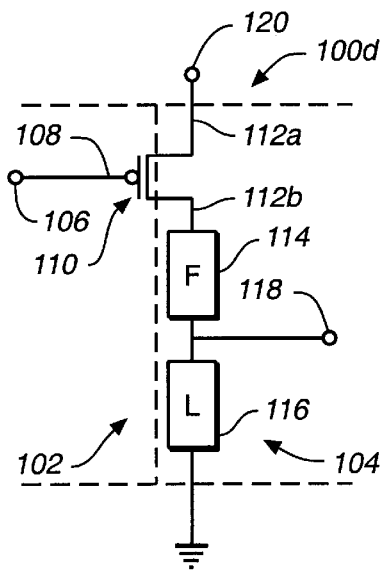
FIG._4

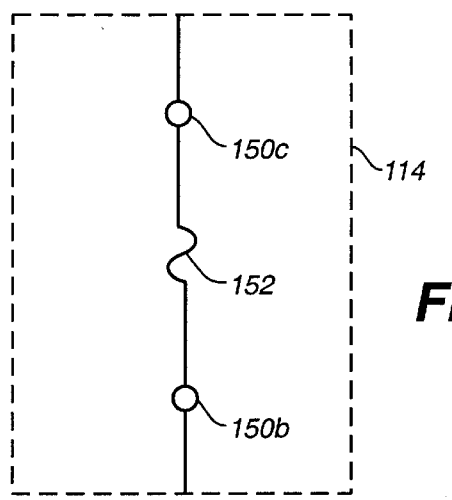
FIG._5
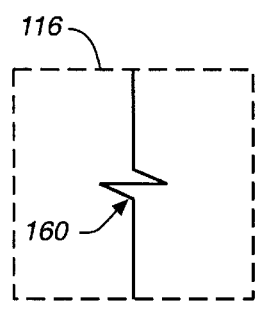
FIG._6
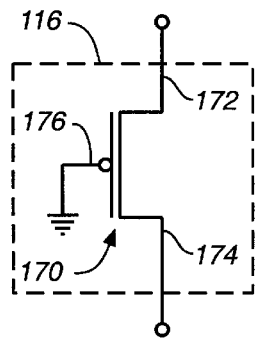
FIG._7
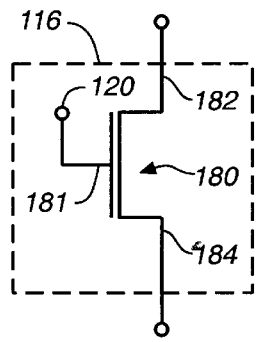
FIG._8

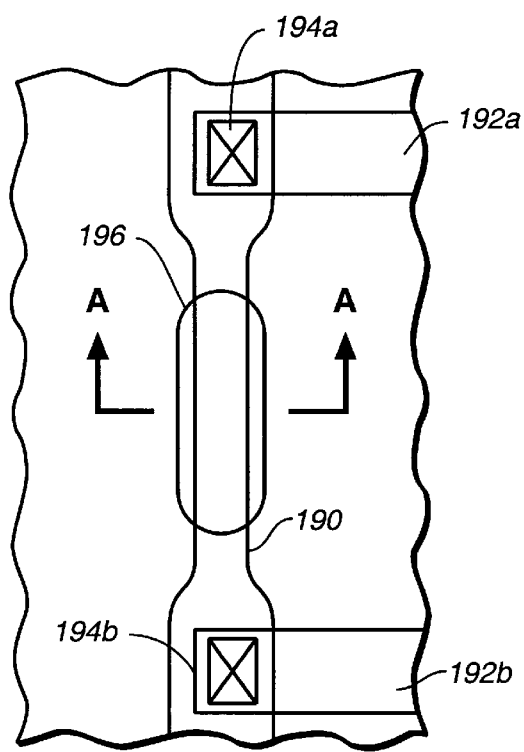
FIG._9
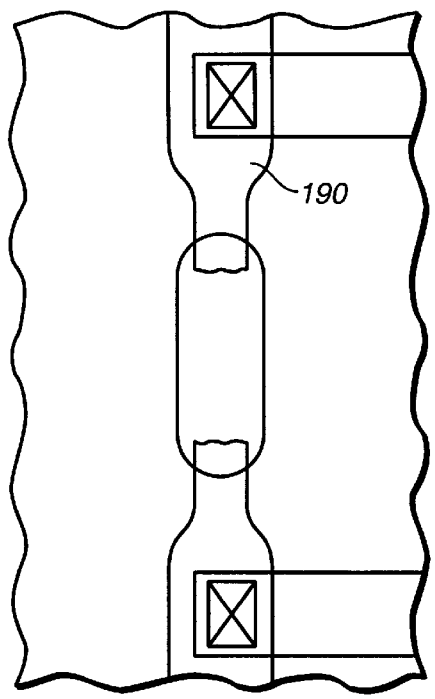
FIG._11
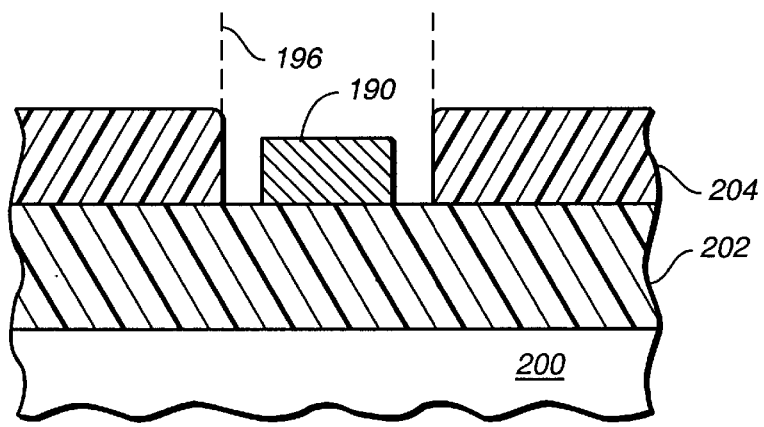
FIG._10

CIRCUIT AND METHOD FOR ENCODING AND RETRIEVING A BIT OF INFORMATION

BACKGROUND OF THE INVENTION

1. Field of the Invention

The present invention relates to the field of semiconductors and more particularly to a method and circuit for encoding a bit of information in a semiconductor device utilizing a fuse circuit with an alterable impedance.

2. Description of the Relevant Art

Semiconductor devices have been widely utilized in the electronics industry for an enormous variety of functions and tasks since the introduction of commercially feasible integrated circuits in the early 70's. A semiconductor device is typically characterized by a large number of individual circuit elements such as transistors, diodes, capacitors, and resistors all fabricated essentially simultaneously on a common monolithic semiconductor substrate such as single crystal silicon. Once fabricated, these individual circuit elements are then selectively connected to one another with one or more levels of patterned interconnect layers to achieve a desired functionality. Among the many varieties of devices fabricated using semiconductor technology are the microprocessors, controllers, and memory devices well known to designers, manufacturers, and users of personal computers and workstation as well as an enormous number of other types of devices.

The essential characteristics of fabrication processes employed to manufacture semiconductor devices are as well known within the semiconductor industry as the devices themselves. It is sometimes useful to describe a semiconductor fabrication process as having a "front end" in which the active areas of the device are defined and the individual circuit elements are produced and a "back end" in which the individual circuit elements are selectively coupled to one another through the use of interconnect levels. Both the front end and back end typically include process sequences in which a desired pattern is deposited upon, etched into, or grown within the underlying structure through the use of well known deposition, photolithography, and etch processes. Each photolithography sequence includes the selective exposure of a photoresist material. This selective exposure is overwhelmingly accomplished by accurately positioning a photomask comprised of opaque and transparent regions that define the desired pattern between an unexposed photoresist layer deposited on the device substrate and an exposing radiation source such as a mercury vapor lamp. One measure of the complexity and cost of any given semiconductor fabrication process is the number of these so called "mask" steps required to produce a given device. All else being equal, fewer mask steps are always preferable to more mask steps because of the enormous cost of the photoalignment equipment and the time required to complete each mask step. Despite this preference for fewer mask steps, it is not uncommon to encounter multiple interconnect level CMOS processes that require in excess of twenty mask steps. Manufacturers therefore typically resist introducing new elements that require additional mask steps into a fabrication process.

Semiconductor fabrication processes are most commonly accomplished using large circular wafers as the starting material. Because these wafers comprise an area that is typically much larger than the area required to produce the desired device, an array of devices is typically fabricated on each wafer. Each of the individual devices is commonly referred to as a "die." Most mask steps in modern fabrication processes are of the "step and repeat" variety in which only one die is exposed at any time. The photoalignment equipment exposes the entire array of die by stepping the photomask through the entire array. It will be appreciated that, as a result of this exposure technique, each die would be essentially identical to each other die on the wafer but for randomly occurring defects that are generated during every manufacturing process. While this uniformity is generally highly desirable, semiconductor manufacturers would occasionally prefer to encode unique information into each die. If, for example, a semiconductor manufacturer wanted to encode a unique and electrically detectable serial number or other useful information into each device, a mechanism for incorporating this unique information into each die would be required. In some cases, the incorporation of such a mechanism might be compatible with the particular fabrication process used to fabricate the associated integrated circuit. Incorporating a unique information mechanism into a process used to fabricate an electrically programmable read only memory (EPROM), as an example, would be relatively easy to accomplish without increasing the complexity of the process because the EPROM process already requires the process steps necessary to implement such a mechanism. More particularly, because the EPROM process requires a floating gate and other circuit elements necessary to produce and program an EPROM cell, the unique information mechanism itself could be comprised essentially of a dedicated section of EPROM cells. The process technologies used to fabricate the great majority of devices, however, do not readily avail themselves of a technique by which a unique information storage mechanism could be incorporated into the device. In addition, even in the case of EPROMs, it would be highly desirable if the implemented mechanism consumed the smallest amount of area possible. EPROM circuits and other circuits that would require the generation of large drive currents to effect an essentially permanent change in the circuit generally require a relatively large area require area to implement.

Accordingly, it would be highly desirable to incorporate a mechanism by which unique information could encoded into each device without significantly increasing the complexity or cost of the fabrication process used to manufacture the device and without introducing complex circuitry that consumes relatively large areas of the die.

SUMMARY OF THE INVENTION

The problems identified above are in large part addressed by a method and circuit for encoding and electrically detecting a bit of information in a semiconductor device. The invention contemplates the incorporation of a fuse circuit that can be fabricated without increasing the complexity of the fabrication process and yet consumes a relatively small area of the device. The impedance of the fuse circuit is alterable and the invention is configured to produce an output signal that is indicative of the fuse circuit impedance thereby conveying a bit of information.

Accordingly, it is an object of the present invention to provide a circuit suitable for encoding and retrieving a bit of information from an integrated circuit. It is a further object to provide for an information circuit that is manufacturable with existing semiconductor fabrication processes. It is a further object to provide an information circuit in an integrated circuit that consumes a relatively small area of the device. It is a further object of the invention to provide for a method for encoding and retrieving a bit of information within a semiconductor integrated circuit.

Broadly speaking, the present invention contemplates an information circuit in a semiconductor device. The information circuit is suitable for encoding and retrieving a bit of information. The information circuit includes an input circuit and an output circuit. The input circuit includes an input node coupled to an input terminal of a transistor. The output circuit includes a load device, a fuse circuit, and first and second output terminals of the transistor. These elements of the output circuit are coupled in series between a power supply terminal and a ground terminal. An output node of the information circuit is coupled to the output circuit. The information circuit is configured such that the output node voltage is indicative of the impedance of the fuse circuit when the input node is biased to a "read" state, the power supply terminal is biased to a power supply voltage, and the ground terminal is grounded. Accordingly, by setting the impedance of the fuse circuit, a bit of information is conveyed by the information circuit.

In a presently preferred embodiment, the impedance of the fuse circuit is alterable. Preferably, the impedance of the fuse circuit prior to alteration is finite and substantially infinite after alteration. In one embodiment, the alteration of the impedance is irreversible such that the impedance may be altered only once. Preferably, the transistor is a field effect transistor (FET) that includes a gate terminal, a drain terminal, and a source terminal. The gate terminal of the FET serves as the input terminal of the transistor which is coupled to the input node of the information circuit. The source and drain terminals of the FET serve as the first and second output terminals respectively of the transistor. In the preferred embodiment, the FET is an n-channel device. In one embodiment, the source terminal is grounded and the drain terminal is coupled to a first terminal of the fuse circuit. The second terminal of the fuse circuit is coupled to the output node of the information circuit and to a first terminal of the load device while a second terminal of the load device is connected to the power supply terminal. In an alternative embodiment, the fuse circuit is interchanged with the output terminals of the FET such that a first terminal of the fuse circuit is grounded and a second terminal of the fuse circuit is coupled to the source terminal of the transistor. The drain terminal of the transistor is coupled to the output node and to a first terminal of the load device. In this embodiment, the second terminal of the load device is coupled to the power supply terminal.

In another embodiment, a p-channel FET is utilized for the transistor. The source terminal may then be coupled to the power supply terminal and the drain terminal coupled to a first terminal of the fuse circuit. The second terminal of the fuse circuit is coupled to the output node of the information circuit and to a first terminal of the load device. The second terminal of the load device is then connected to the power supply terminal. Alternatively, the first terminal of the fuse circuit may be coupled to the power supply terminal and the second terminal of the fuse circuit coupled to the source terminal of the transistor. The drain terminal of the transistor is then coupled to the output node of the information circuit and to the first terminal of the load device The second terminal of the load device is then coupled to the power supply terminal.

In one embodiment, the fuse circuit initially includes a conductive fuse link connected between a pair of fuse terminals. In this embodiment, the alteration of the fuse circuit impedance is achieved by substantially eliminating the conductive fuse link thereby creating a substantially open circuit between the pair of fuse terminals. In one embodiment, the conductive fuse link includes heavily doped polysilicon, preferably with a sheet resistivity of less than approximately 500 Ω/square. In an alternative embodiment, the conductive fuse link may be comprised of aluminum, copper, or an appropriate alloy thereof The elimination of the conductive fuse link is accomplished in one embodiment by directing a laser beam at the conductive link. The load device may be comprised of a resistor such as a polysilicon resistor or, alternatively, may be comprised of a transistor. In an embodiment in which the load device is a transistor, the gate terminal of the load device is typically biased to the power supply voltage in the case of an n-channel load and grounded in the case of a p-channel load.

The present invention still further contemplates a method of encoding a bit of information in a semiconductor device. First, the device is designed and fabricated to include an information circuit as described in the preceding paragraphs. Then, a desired state of the bit of information is determined according to the information that is sought to be stored in the device. Thereafter, the fuse circuit impedance is altered, preferably to an essentially infinite or open circuit impedance value, if the desired state of the bit of information is equal to a first state. If the desired state of the bit of information is equal to a second state, then the fuse circuit impedance is left unaltered. In the preferred embodiment, the alteration of the fuse circuit impedance is achieved by directing an energetic beam such as a laser beam at a conductive link of the fuse circuit. The conductive link is preferably formed over a relatively thick dielectric film. In this embodiment, the initial or unaltered impedance of the fuse circuit is finite while the impedance after alteration is essentially infinite. The configuration of the information circuit is such that the alteration of the fuse circuit impedance may be detected electrically by applying an appropriate bias to an input node of the information circuit and detecting the voltage of an output node of the circuit.

The present invention still further contemplates a method of retrieving a bit of information from an integrated circuit. The integrated circuit is designed and fabricated to include an information circuit as described in the preceding paragraphs. Thereafter, the impedance of the fuse circuit of the information circuit is altered to reflect the desired state of the bit of information. The input node of the information circuit is subsequently biased to a "read" state and the output node of the information circuit monitored to detect the output node voltage. Because the information circuit is configured to output a voltage level that is indicative of the impedance of the fuse circuit, the bit of information stored in the information circuit is thereby detected.

BRIEF DESCRIPTION OF THE DRAWINGS

Other objects and advantages of the invention will become apparent upon reading the following detailed description and upon reference to the accompanying drawings in which:

FIG. 1 is a diagram of a first embodiment of an information circuit for encoding and retrieving a bit of information in which the transistor is an n-channel device and the fuse element is connected in series between the source terminal of the transistor and the ground terminal;

FIG. 2 is a second embodiment of an information circuit according to the present invention including an n-channel transistor where the fuse circuit is connected in series between the output node and the drain terminal of the transistor;

FIG. 3 is a diagram of a third embodiment of an information circuit according to the present invention including a p-channel transistor where the fuse circuit is connected in series between a drain terminal of the transistor and the power supply terminal;

FIG. 4 is a fourth embodiment of an information circuit according to the present invention including a p-channel transistor and where the fuse circuit is connected in series between the source terminal of the transistor and the output node of the information circuit;

FIG. 5 is a diagram of the fuse circuit of FIGS. 1 through 4 including a fuse link connected between a pair of fuse terminals;

FIG. 6 is a diagram of a first embodiment of the load device depicted in FIGS. 1 through 4 in which the load device comprises a resistor;

FIG. 7 is a diagram of a second embodiment of the load device of FIGS. 1 through 4 in which the load device comprises a p-channel transistor;

FIG. 8 is a diagram of a third embodiment of the load device shown in FIGS. 1 through 4 in which the load device comprises an n-channel transistor, FIG. 9 depicts a partial layout of one embodiment of the fuse circuit of FIG. 5;

FIG. 10 is a partial cross-sectional view of the fuse circuit shown in FIG. 9; and FIG. 11 is a depiction of the fuse circuit of FIG. 9 after alteration of the fuse link.

While the invention is susceptible to various modifications and alternative forms, specific embodiments thereof are shown by way of example in the drawings and will herein be described in detail. It should be understood, however, that the drawings and detailed description presented herein are not intended to limit the invention to the particular embodiment disclosed, but on the contrary, the intention is to cover all modifications, equivalents, and alternatives falling within the spirit and scope of the present invention as defined by the appended claims.

DETAILED DESCRIPTION OF THE INVENTION

Turning now to the drawings, FIGS. 1 through 4 depict various embodiments of an information circuit 10 according to the present invention. The various embodiments are identified by reference numerals 100a, 100b, 100c, and 100d in FIGS. 1, 2, 3, and 4 respectively and are generically or collectively referred to herein as information circuit(s) 100. In each of the figures, the information circuit 100 is designed for encoding and retrieving a bit of information. Each of the information circuits 100 includes an input circuit 102 and an output circuit 104. The input circuit 102 includes an input node 106 that is coupled to an input terminal 108 of a transistor 110. The output circuit 104 includes a load device 116, a fuse circuit 114, and first and second output terminals 112a and 112b respectively of transistor 110. Load device 116, fuse circuit 114, and output terminals 112a and 112b of transistor 110 are coupled in series between a power supply terminal 120 and a ground terminal 122. Information circuit 100 further includes an output node 118 that is coupled to the output circuit 104. Information circuit 100 is further configured in each of the embodiments, as described in greater detail below, such that a voltage of output node 118 is indicative of an impedance of fuse circuit 114 when input node 106 is biased to a "read" state, the power supply terminal 120 is biased to a power supply voltage, and the ground terminal is grounded. In this manner, information circuit 100 conveys the bit of information based on the impedance of fuse circuit 114.

In a presently preferred embodiment, the impedance of fuse circuit 114 is alterable. In the most common embodiment, the impedance of fuse circuit 114 is finite prior to alteration and substantially infinite after alteration. In one embodiment, it is contemplated that the fuse circuit may be altered once and only once from the initial state in which the fuse circuit is conductive to the altered state in which the fuse circuit comprises an essentially open circuit. Turning momentarily to FIG. 5, the fuse circuit 114 is shown in greater detail as including a fuse link 152 coupled between a pair of fuse terminals 150a and 150b. The fuse link 152 may comprise any suitable conductive element compatible with a conventional semiconductor fabrication process including, for example, heavily doped polysilicon, copper, aluminum and suitable alloys thereof. For purposes of this disclosure, heavily doped polysilicon includes any polysilicon having a sheet resistivity of less than 500 Ω/square. Turning momentarily to FIGS. 9 through 11, a layout of one embodiment of the fuse circuit 114 is shown. In FIG. 9, the fuse circuit 114 includes a fuse link 190 that is coupled to a pair of conductors 192a and 192b through contacts 194a and 194b respectively. Fuse link 190 of FIG. 9 serves as fuse link 152 of FIG. 5. It will be appreciated to those skilled in the field of semiconductor fabrication process that a dielectric or insulating layer (such as a CVD silicon dioxide film) will have been deposited over fuse link 190 prior to the formation of the conductors 192a and 192b. The conductors are suitably comprised of an interconnect material such as aluminum, copper, tungsten, or various alloys thereof. To remove a portion of the dielectric layer formed over the fuse link 190, a fuse window 196 is etched into the dielectric material to clear all or a portion of the dielectric material over the fuse link 190 prior to alteration of the fuse.

Turning to FIG. 10, a partial cross-section taken along view A—A of FIG. 9 is shown. In FIG. 10, the fuse link 190 is shown as deposited over a relatively thick dielectric material 202 which is formed over a semiconductor substrate 200. Typically, the dielectric material 202 includes all or a portion of the field oxide typically formed in conventional MOS fabrication processes. The starting material for semiconductor substrate 200 is suitably comprised of single crystal silicon wafer as is well known in the field of semiconductor fabrication. The purpose of the fuse window 196 is shown with greater clarity in FIG. 10 where a portion of the dielectric material 204 is cleared from the vicinity of fuse link 190. Although FIG. 10 shows that substantially all of the dielectric material 204 is removed from the region of fuse link 190, it will be appreciated that the etch process associated with the formation of the fuse window 196 may be controlled such that a thin layer of dielectric material may remain over the fuse circuit element.

In one embodiment, it will be appreciated that the formation of the fuse window 196 may be accomplished simultaneously with the formation of the contacts 194 shown in FIG. 9 thereby avoiding the necessity of incorporating an additional masking step into the process. In an embodiment of the fuse circuit 114 in which the fuse link 152 comprises the fuse link 190 as shown in FIG. 9, it will be also appreciated that the formation of the polysilicon element is suitably accomplished simultaneously with the formation of the polysilicon gates well known in conventional MOS fabrication processes. By utilizing existing process steps for the creation of the fuse link 190 and the fuse window 196, the fuse circuit 114 may be incorporated into the information circuit 100 with substantially little or no increase in the complexity and cost of the fabrication process. Moreover, because the polysilicon deposition and etch process and the contact mask formation are standard elements within a typical MOS process, the fuse circuit 114 shown in FIGS. 1 through 4 is feasible in essentially every MOS process without regard to the particular integrated circuit that is being fabricated. It will be further appreciated by those skilled in the art that although the description herein describes one embodiment of the fuse circuit 114 in which the fuse link 152 is comprised of heavily doped polysilicon (such as the polysilicon formed during a conventional gate deposition process), various conductive elements such as aluminum, copper, tungsten, various refractory metals, and suitable alloys and compositions thereof, may used in lieu of polysilicon. The essential characteristic of the fuse link 152 is that it is readily able to conduct current in an initial state and is capable of being altered such that the impedance of the fuse circuit 114 is substantially increased after the alteration.

Turning now to FIG. 11, an embodiment of the present invention is shown in which the alteration of fuse circuit 114 to increase the impedance of fuse link 152 is depicted in which the increase in impedance is accomplished by substantially eliminating a portion of the fuse link 190 to create an essentially open circuit. In one embodiment, this alteration may be suitably accomplished by directing a high energy beam at the fuse link 190 and maintaining the beam upon the fuse link for a duration sufficient to blow the link and create an open circuit. In one embodiment, the energetic beam may be comprised of a laser beam generated and accurately positioned through the use of commercially available laser machines. In such machines, the positioning of the laser beam is controlled through the use of accurate servo motors or through the use of step and repeat table positioning systems similar in nature to the positioning systems found within photoalignment equipment. Typically, a reference position within the integrated circuit is detected by incorporating alignment marks into known locations of the integrated circuit. These alignment marks are typically comprised of reflective material such that when a laser beam is directed at the alignment mark, the reflective material is detected by monitoring the energy of the beam reflected back from the wafer surface. Once a reference position has been established, the laser beam may be suitably directed to the location of the fuse link 190 and, thereafter, the beam parameters such as energy, diameter, and pulse duration may be suitably adjusted to optimize the elimination of the fuse link 190. From the preceding discussion, it will be appreciated that the significant characteristics of the fuse circuit 114 and the fuse link 152 in the presently preferred embodiment are that the fuse link 152 is alterable from a conductive initial state to an essentially open altered state. In addition, the fuse link 152 must be of a suitable dimension and composition that is compatible with elimination by a technique such as the laser technique described. The use of an external mechanism to alter the impedance of the fuse circuit 114 is advantageous in the present invention in that alternative methods of blowing a fusible link typically involve the generation of a high drive current that is directed through the fuse link. The circuitry necessary to generate this current typically consumes a far greater area of the integrated circuit than is desirable. Particularly in an embodiment in which it is contemplated that a plurality of information circuits will be incorporated into the integrated circuit, it is important to minimize the area consumed by each individual information circuit 100. In an embodiment in which it is contemplated that, for example, it is desirable to incorporate an electrically detectable serial number into the integrated circuit through the use of a plurality of information circuits 100, it will be appreciated that 20 or more such information circuits may be desirable to permit a large number of unique serial numbers.

Returning now to FIGS. 1 through 4, various specific embodiments of information circuit 100 are shown. In each of the figures, the essential characteristic of the information circuit 100 is that the output signal represented by the voltage of the output node 118 is indicative of the impedance of the fuse circuit 114. Therefore, storage and retrieval of a bit of information is accomplished by altering the impedance of the fuse circuit appropriately. Turning now to FIG. 1, an embodiment of information circuit 100 is shown in which the transistor 110 is a field effect transistor (FET). More specifically, the embodiment in FIG. 1 depicts an n-channel transistor including a gate terminal, a source terminal, and a drain terminal. The gate terminal of the transistor 110 serves as the input terminal 108 of transistor 110 and is coupled to the input node 106 of information circuit 100. The drain and source terminals serve as first and second output terminals 112a and 112b respectively of transistor 110. In the particular embodiment shown in FIG. 1, a first terminal of the fuse circuit 114 is coupled to a ground terminal 122 while a second terminal of fuse circuit 114 is coupled to the second output terminal 112b of transistor 110 (i.e., the source). The first output terminal 112a, which is the drain terminal of transistor 110 in this embodiment, is connected to a first terminal of the load device 116 and also to the output node 118 of information circuit 100. The second terminal of the load device is coupled to the power supply terminal 120.

Turning momentarily to FIGS. 6 through 8, various embodiments of the load circuit 116 are depicted. In the first embodiment shown in FIG. 6, the load device 116 may be comprised simply of a semiconductor resistor 160. Semiconductor resistors are well known and are typically comprised of doped polysilicon. A disadvantage associated with such load devices is that the associated fabrication process may require two polysilicon deposition steps (one being associated with the polysilicon gates and the other being associated with the polysilicon resistors). An additional drawback of a resistor type load device 116 is that the area consumed by polysilicon resistors is typically greater than the area consumed by alternative load devices such as the active load devices described with respect to FIGS. 7 and 8.

In FIG. 7, the load device 116 comprises a long channel (i.e., a channel length greater than approximately 1 micron) p-channel transistor 170 in which the input terminal or gate terminal 176 is grounded such that the transistor is essentially always "on". By grounding the input terminal, the output terminals are free to conduct current in much the same manner as a resistor thereby providing a method by which the load device may bias the output node 118 of the information circuit 100 to a known state in the absence of a stronger signal driving the output level of output node 118. If, for example, the fuse link 114 has been altered such that the fuse circuit 114 comprises essentially an open circuit, the output node 118 of information 100, which would otherwise be floating, is biased to a known output state by the load device 116. If, on the other hand, the fuse circuit 114 is in its initial conductive state, the output voltage on output node 118 is controlled by the input signal at input node 106. Thus a mechanism for detecting the impedance of the fuse circuit is provided. If the input node 106 is held at an appropriate input level, the output voltage at output node 118 will be driven to essentially ground if the fuse circuit 114 is conductive whereas the output voltage 118 will be held at the power supply voltage applied to power supply 120 if the conductive fuse circuit 114 comprises an open circuit. It is to be understood that the power supply and ground signals are provided by external power supply means such that the power supply is not inherently a component of the information circuit 100. The power supply terminal and ground terminal 120 are, however, suitably adapted for interconnection to such power supply and grounding means.

In FIG. 8, a third embodiment of an active load device 116 is depicted in which the load device comprises an n-channel transistor 180 in which the gate terminal 181 is coupled to the power supply terminal 120. By biasing the gate terminal of the n-channel transistor to the power supply voltage, the transistor is effectively "on" such that current is permitted to flow freely from the drain terminal 182 to source terminal 184 in the presence of a bias between these two output terminals. In the case of the active load devices depicted in FIGS. 7 and 8, long channel transistors are used such that any contention over the output signal at output node 118 will be resolved in favor of the transistor 110 which is contemplated to be a short channel device in the preferred embodiment. For purposes of this disclosure, a short channel device refers to a transistor in which the channel length is less than approximately 1 micron.

Returning now to FIG. 1, it will be appreciated that the bit of information encoded within the fuse circuit 114 is retrieved by biasing the power supply terminal 120 to a power supply voltage typically on the order of 3.3 volts or less and grounding the ground terminal 122. Thereafter, the input node 106 is biased to a voltage in excess of the threshold voltage of the transistor 110 and is more suitably biased to a voltage approximately equivalent to the power supply voltage applied to power supply terminal 120. In this manner, the transistor 110 is driven into saturation. Under these conditions, the output voltage at output node 118 will reflect the impedance of fuse circuit 114. If the input voltage is reduced to less than the absolute value of the threshold voltage of transistor 110, the output voltage at output node 118 will be tied to the power supply voltage through load device 116 regardless of the condition of fuse circuit 114. FIGS. 2 through 4 depict alternative embodiments representing variations on the essential information circuit 100.

In FIG. 2, an n-channel transistor is used as transistor 110 but the series positioning of the fuse circuit 114 and the output terminals 112a and 112b of transistor 110 have been interchanged with respect to the position shown in FIG. 1. The operation of the circuit in FIG. 2 is, nevertheless, the functional equivalent of the operation of the circuit described with respect to FIG. 1. In other words, applying an appropriate "read" voltage to input terminal 106 will result in an output voltage at output node 118 that is close to ground if the fuse circuit 114 is in a conductive state whereas the output voltage will be tied to the power supply voltage through load device 116 if the fuse circuit 114 is in a high impedance or open circuit or altered state.

Turning to FIG. 3, an embodiment of information circuit 100 is depicted in which the transistor 110 comprises a p-channel device. In this embodiment, the information is "read" by biasing input node 106 to an input voltage that is less than the voltage applied to the power supply terminal 120 by a margin greater than the absolute value of the threshold voltage of transistor 110. Still more preferably, the input node 106 is held at a voltage close to ground. If the fuse circuit 114 is in its initial conductive state, the voltage drop across the output terminals 112a and 112b will be minimized and the output voltage at output node 118 will be driven to a value approximating the power supply voltage. If the fuse circuit 114 has been altered to create an open circuit, the output voltage at output node 118 will be tied to ground through load device 116 regardless of the state of input node 106.

Similarly in FIG. 4, a p-channel device 110 is used and the voltage of output node 118 will rise to the power supply voltage applied to power supply terminal 120 when transistor 110 is biased into saturation by applying a "0" to input node 106 if the fuse circuit 114 is in its initial conductive state. If on the other hand, the fuse circuit 114 has been altered to create an open circuit, the output voltage at output node 118 will be tied to ground through the load device 116 regardless of the state of input node 106. Thus, the circuits depicted in FIGS. 1 through 4 present means by which a bit of information may be encoded and retrieved within an integrated circuit. Those familiar with semiconductor layout will appreciate that the area consumed by the various information circuits 100 is relatively insignificant in that the entire circuit comprises essentially the area required for two transistors and a fuse circuit. Because the ideal fuse circuit has zero resistance in its conductive state, the length of the fuse circuit should be minimized to the extend compatible with the means used for altering the fuse circuit.

It will be appreciated to those skilled in the art that the present invention contemplates a method for encoding and retrieving a bit of information from an information circuit utilizing an externally alterable fuse circuit element requiring a relatively small area that is compatible with conventional semiconductor fabrication processes. It is understood that the form of the invention shown and described in the detailed description and the drawings are to be taken merely as presently preferred examples. It is intended that the following claims be interpreted broadly to embrace all the variations of the preferred embodiments disclosed.

What is claimed is:

1. In a semiconductor device, an information circuit for encoding and retrieving a bit of information, said circuit consisting of:

p-channel field effect transistor (FET), wherein a gate terminal of said transistor is coupled to an input node of said circuit;

a load device wherein a first terminal of said load device is grounded and a second terminal of said load device is connected to an output terminal of said information circuit; and a laser programmable fuse coupled in series with source and drain terminals of said transistor between a power supply terminal and said output terminal;

wherein said information circuit is configured such that a voltage of said output node is indicative of an impedance of said fuse when said input node is biased to a read state, said power supply terminal is biased to a power supply voltage, and said ground terminal is grounded, whereby said bit of information is conveyed by said impedance.

2. The information circuit of claim 1, wherein said laser programmable fuse comprises a variable impedance fuse, and further wherein said impedance is finite prior to alteration by a laser and substantially infinite after alteration by a laser.

3. The information circuit of claim 1, wherein a source terminal of said transistor is coupled to said power supply terminal and a drain terminal of said transistor is coupled to a first terminal of said fuse, and further wherein a second terminal of said fuse is coupled to said output node of said information circuit.

4. The information circuit of claim 1, wherein a first terminal of said fuse is coupled to said power supply terminal and a second terminal of said fuse is coupled to a source terminal of said transistor, and further wherein a drain terminal of said transistor is coupled to said output node of said information circuit.

5. The information circuit of claim 1, wherein said fuse comprises a variable impedance fuse link having a finite impedance connected between a pair of fuse terminals prior to alteration of said link by a laser and having a substantially infinite impedance subsequent to alteration by said laser.

6. The information circuit of claim 1, wherein said laser programmable fuse comprises heavily doped polysilicon.

7. The information circuit of claim 1, wherein said fuse is alterable from an initial state to an altered state by directing a laser at said fuse.

8. The information circuit of claim 1, wherein said load device comprises a resistor.

9. The information circuit of claim 1, wherein said load device comprises a load transistor.

* * * * *